United States Patent
Fischer et al.

(10) Patent No.: US 6,618,410 B1
(45) Date of Patent: Sep. 9, 2003

(54) OPTOELECTRONIC SEMICONDUCTOR COMPONENT

(75) Inventors: Frank Fischer, Reutlingen (DE); Günter Reuscher, Würzburg (DE); Thomas Litz, Gomaringen (DE); Gottfried Landwehr, Würzburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/455,603

(22) Filed: Dec. 6, 1999

Related U.S. Application Data

(63) Continuation of application No. PCT/DE98/01404, filed on May 22, 1998.

(30) Foreign Application Priority Data

Jun. 5, 1997 (DE) .......... 197 23 677

(51) Int. Cl.⁷ .............. H01S 5/00; H01S 3/08
(52) U.S. Cl. .......... 372/45; 372/96
(58) Field of Search .............. 372/50, 96, 45

(56) References Cited

U.S. PATENT DOCUMENTS

| | | | | |
|---|---|---|---|---|
| 5,018,157 A | * | 5/1991 | Deppe et al. | 372/45 |
| 5,208,820 A | | 5/1993 | Kurihara et al. | 372/45 |
| 5,212,706 A | * | 5/1993 | Jain | 372/50 |
| 6,052,398 A | * | 4/2000 | Brillouet et al. | 372/45 |

FOREIGN PATENT DOCUMENTS

| | | | |
|---|---|---|---|
| EP | 0 709 939 A1 | 5/1996 | .......... H01S/3/085 |
| JP | 03-191579 | 8/1991 | |
| JP | 05-041534 | 2/1993 | |
| JP | 06-140721 | 5/1994 | |
| JP | 08-213702 | 8/1996 | |
| JP | 08-236854 | 9/1996 | |
| WO | WO 98/07218 | 2/1998 | .......... H01S/3/085 |

OTHER PUBLICATIONS

Sugg et al. "n–p–(p⁺–n)–n $Al_yGa_{1-y}As$–GaAs–$In_xGa_{1-x}$ As Quantum–Well Laser with p⁺–n⁺GaAs–InGaAs Tunnel Contact on n–GaAs", 320 Applied Physics Letters 62, No. 20, New York, 1993, pp. 2510–2512. (May 1993).

"Oberflächenemittierende Laser (VCSEL)" (Surface–Emitting Laser). Bludau, W., Halbleiter–Optoelektronik, 1995 (no month), pp. 188–189.

Thibeault et al. "Reduced Optical Scattering Loss in Vertical–Cavity Lasers Using a Thin (300 Å) Oxide Aperture", IEEE Photonics Technology Letters, Vol. 8, No. 5, May 1996, pp. 593–595.

Chua et al. "Long Wavelength VCSELs Using AlAs/GaAs Mirrors and Strain–Conpensated Quantum Wells", Proceedings of the IEEE/Cornell Conference on Advanced Concepts in High Speed Semiconductor Devices and Circuits, New York, 1995. (Aug. 1995).

* cited by examiner

*Primary Examiner*—Quyen Leung
(74) *Attorney, Agent, or Firm*—Laurence A. Greenberg; Werner H. Stemer; Ralph E. Locher

(57) ABSTRACT

An Optoelectronic semiconductor component, in which an active zone is disposed above a semiconductor substrate, and which zone is disposed between at least one first resonator mirror layer and at least one second resonator mirror layer. The first and the second mirror layer each have a semiconductor material of a first conductivity type. At least one first heavily doped junction layer of the first conductivity type and at least one second heavily doped junction layer of a second conductivity type are disposed between the active zone and one of the two mirror layers in such a way that the second heavily doped, degenerate junction layer lies between the active zone and the first heavily doped, degenerate junction layer.

14 Claims, 4 Drawing Sheets

OPTOELECTRONIC SEMICONDUCTOR COMPONENT

CROSS-REFERENCE TO RELATED APPLICATION

This is a continuation of copending International Application PCT/DE98/01404, filed May 22, 1998, which designated the United States.

BACKGROUND OF THE INVENTION

Field of the Invention

The invention relates to an optoelectronic semiconductor component having a semiconductor body that is suitable for generating electromagnetic radiation. In the optoelectronic component, an active zone is disposed above a semiconductor substrate, within which zone the electromagnetic radiation is generated in the event of a current flow through the semiconductor body and which zone is disposed between at least one first resonator mirror layer and at least one second resonator mirror layer.

An optoelectronic semiconductor component having a semiconductor body of this type is, for example, a so-called vertical cavity surface emitting laser (VCSEL). In the case of the component, the light generated in the active zone of a heterostructure is reflected perpendicularly to the layer structure having the active zone between the two resonator mirror layers. That is to say in the direction of current flow, and the light is coupled out from the semiconductor body at a steep angle with respect to the surface of the semiconductor heterostructure through one of the reflector mirror layers.

An optoelectronic semiconductor component of this type and its functional principle are disclosed for example in a reference by W. Bludau, titled "Halbleiter-Optoelektronik" [Semiconductor Optoelectronics], Hansa-Verlag, Munich, Vienna, 1995, pages 188 and 189, wherein a VCSEL diode is described in which a semiconductor body is applied on an n-conducting substrate. The semiconductor body contains a first layer sequence made up of n-doped mirror layers (lower resonator mirror layer), a region with the active zone and a second layer sequence made up of p-doped mirror layers (upper resonator mirror layer). The electrical connection of the semiconductor body is realized by an ohmic top-side contact on the upper mirror and an underside contact on the substrate. The precise method of operation is described in the above-mentioned literature reference and, therefore, is not explained in any more detail at this point.

The lower resonator mirror layer is, for example, a periodic sequence of alternately GaAs or AlGaAs and AlAs or AlGaAs layers having a high or low refractive index whose respective layer thickness is ¼ of the wavelength emitted by the active zone divided by the refractive index of the material. The periodic sequence being doped in an n-conducting fashion with silicon and being applied epitaxially prior to the deposition of the active layer sequence on the semiconductor substrate. The reflectivity of the mirror is set by the number of layer pairs. On this n-conducting so-called Bragg reflector, there is applied for example an n-conducting first barrier layer, e.g. composed of AlGaAs, an active zone, e.g. with an InGaAs/GaAs multiple quantum well structure (MQW), and a p-conducting second barrier layer, e.g. composed of AlGaAs, in such a way that the active zone is embedded between the barrier layers.

Adjoining the p-conducting second barrier layer is the upper resonator mirror layer, e.g. a GaAs/AlAs Bragg reflector doped in a p-conducting fashion with beryllium or carbon, on the top side of which reflector is disposed an ohmic top-side contact. After the application of an electric voltage between the top-side and underside contacts, in such a way that the pn junction of the active zone is forward-biased, in the example chosen negative charge carriers are injected from the substrate side through the n-conducting lower Bragg mirror into the active zone. Holes are injected from the top-side contact through the p-conducting upper Bragg reflector.

Similar optoelectronic semiconductor components are described for example in Iga, Inst. Phys Conf. Ser. 145 (8), 1996, pages 967 to 972, and can be produced from different materials for different wavelength ranges of the electromagnetic radiation.

In the case of the VCSEL concept, a large number of lasers can be defined in the lateral direction on a semiconductor substrate and, consequently, it is easy to form laser arrays having more advantageous beam characteristics compared with the so-called separate confinement heterostructure (SCH) lasers.

In the semiconductor laser structures referred to above, the particular problem arises that the p-conducting Bragg reflector made up of GaAs/AlAs, AlGaAs/AlAs or AlGaAs/GaAs layer sequences has a high electrical resistance and therefore causes high electrical losses. Owing to the low thermal conductivity of the above-mentioned materials, the laser diode is consequently heated to a considerable extent during operation. As a result, for example, the lifetime of VCSEL lasers having a high optical output power is severely limited.

Furthermore, the high voltage drops across the p-conducting mirrors prevents the laser diode from being driven with a voltage level of <5 V, which is specified for logic signals.

In order to reduce this problem, the p-conducting mirror layers in VCSEL structures are usually applied on the side of the active zone on which the electromagnetic radiation is coupled out from the semiconductor body. This is because fewer mirror layer pairs are required on this side in order to reduce the reflectivity of this side relative to the opposite n-conducting resonator mirror layer, as a result of which it is possible to couple out the laser radiation. In the case of surface-emitting lasers, therefore, the semiconductor body is usually produced on an n-conducting substrate, as a result of which the p-conducting top side must be given a positive polarity relative to the substrate side. This fact is disadvantageous for the driving of the laser diode, particularly if the targeted, current-regulated driving of a VCSEL diode in a laser array is concerned, as is dealt with in Published, European Patent Application EP 709 939 A1, for example.

Furthermore, it is disadvantageous to produce the GaAs substrates that are usually used in the VCSEL structures described above from p-conducting GaAs, since the latter can be produced with a high structural quality only given a very high technical outlay. They are commercially available, therefore, only with a considerably lower structural quality than e.g. GaAs substrates that are doped in an n-conducting fashion with Si.

Various solution approaches have already been pursued with the purpose of lowering the electrical resistance of the p-conducting Bragg reflectors. In MG Peters et al., J. Vac. Sci. Technol. Volume 12 (6) 1994, pages 3075 to 3083, methods are described in which the transport of holes in p-conducting Bragg mirrors is improved by manipulating the interface material junctions and doping. What is problematic in the case of mirrors based e.g. on InGaAlAs for VCSEL is the large effective mass of the holes and a high energy barrier in the case of the exit of holes, e.g. from a GaAs layer into an AlAs layer. In the case of the methods discussed, the composition of the material is varied in a narrow zone around the GaAs/AlAs interface in different ways between the binary compounds GaAs and AlAs to an AlGaAs alloy and, at the same time, by skillful doping with e.g. Be, C or Si, it is attempted to flatten and minimize the potential barrier.

A further method would be to replace GaAs by the compound AlGaAs in AlGaAs/AlAs Bragg lattices or to replace AlAs by the compound AlGaAs in the GaAs/AlGaAs Bragg lattices. The barrier for holes is thus lowered, as a result of which a smaller electrical resistance is achieved. In this case, however, the fact that the difference in refractive index between AlGaAs and GaAs or AlAs is smaller than in the case of the binary mirrors containing GaAs/AlAs is disadvantageous. It is consequently necessary to apply considerably more mirror pairs in order to obtain a similar reflectivity to that with AlAs/GaAs layer sequences, as a result of which the electrical resistance is again increased.

Furthermore, the thermal conductivity of AlGaAs is considerably lower than that of GaAs or AlAs, as a result of which the thermal energy generated in the laser is dissipated only to an insufficient extent.

A phenomenon that limits the lowering of the electrical resistance in the above-mentioned p-conducting Bragg reflector layers is the occurrence of free charge carrier absorption, which is considerably higher for holes than for electrons. As a result, it is not possible to use acceptor concentrations of arbitrary levels in the p-type Bragg mirrors. Moreover, if Be is used as acceptor material, the dopant diffuses at customary fabrication temperatures, resulting in a weakening of the desired doping profile at the interface which leads to an increase in the resistance and in the threshold current of the VCSEL.

In the case of other semiconductor materials that are likewise used in VCSEL components, such as e.g. InGaAsP or AlInGaAs or II–VI semiconductors such as ZnMgSSe or BeMgZnSe, similar conditions occur. Added to this is the fact that, for example in the case of VCSEL structures on an InP substrate, the production of p-conducting mirrors is considerably more difficult since the difference in refractive index between the p-conducting mirror pairs used, which are lattice-matched to the InP substrate, such as e.g. p-InP/p-InGaAsP, is very small and it is thus necessary to apply a large number of mirror pairs.

In the case of the production of VCSEL components, in particular of Bragg reflector mirror layers, a high reproducibility with which the layer thicknesses and layer compositions can be set during production using molecular beam epitaxy (MBE) or metal organic chemical vapor phase deposition (MOCVD) forms a basic precondition for consistent component properties. An accuracy of better than 3% should be achieved. Due to complicated variations at the interfaces, in particular in the p-conducting mirrors, this reproducibility can be achieved only with great difficulty.

SUMMARY OF THE INVENTION

It is accordingly an object of the invention to provide an optoelectronic semiconductor component which overcomes the above-mentioned disadvantages of the prior art devices of this general type, in which the electrical resistance of the semiconductor body is reduced.

With the foregoing and other objects in view there is provided, in accordance with the invention, an optoelectronic component, including:
 a semiconductor substrate; and
 at least one semiconductor body suitable for generating electromagnetic radiation disposed above the semiconductor substrate, the at least one semiconductor body, containing:
  at least one first mirror layer formed of a semiconductor material of a first conductivity type;
  at least one second mirror layer formed of the semiconductor material of the first conductivity type;
  at least one active zone in which the electromagnetic radiation is generated in an event of a current flow flowing through the at least one semiconductor body, the at least one active zone disposed between the at least one first mirror layer and the at least one second mirror layer;
  at least one first heavily doped, degenerate junction layer of the first conductivity type disposed between the at least one active zone and one of the at least one first mirror layer and the at least one second mirror layer; and
  at least one second heavily, degenerate doped junction layer of a second conductivity type disposed between the at least one active zone and the first heavily doped, degenerate junction layer.

Furthermore, the intention is to provide an improved VCSEL component in which electromagnetic radiation is generated in the range between 350 nm and 3 µm, where the electrical resistance of the component is small, the resulting thermal energy is dissipated well and the component is comparatively simple to produce.

The invention provides for the first and the second resonator mirror layer to have a semiconductor material of a first conductivity type, and for one first heavily doped junction layer of the first conductivity type and one second heavily doped junction layer of a second conductivity type to be disposed between the active zone and one of the two resonator mirror layers, in such a way that the second heavily doped, degenerate junction layer lies between the active zone and the first heavily doped, degenerate junction layer. The first and the second heavily doped junction layer preferably have a dopant concentration of $>1*10^{17}$ cm$^{-3}$.

Thus, in the case of the optoelectronic semiconductor component according to the invention, the active zone is disposed between the two resonator mirror layers having the same conductivity type. Consequently, only one type of charge carrier is used for electrical transport in the resonator mirror layers. In the heavily doped, degenerate layers, the charge carriers are converted into the complementary type of charge carrier and injected into the pn junction of the active zone. In this case, the sequence of degenerate layers is reverse-biased.

In the case of VCSEL structures based on GaAs semiconductor material, the Bragg reflector mirror layers are preferably constructed to be n-conducting, thereby avoiding the disadvantages described for conventional VCSEL structures, in particular the use of a high-resistance and greatly absorptive p-conducting resonator mirror layer and/or of a p-conducting GaAs substrate that can only be produced with a high outlay.

The sequence of heavily doped layers may be situated on the side of the active zone on which the Bragg reflector having the lower reflectivity is situated. In a different refinement, it may be situated on the side of the active zone on which the Bragg reflector having the higher reflectivity is disposed.

The electromagnetic radiation is coupled out from the semiconductor body either on that side of the semiconductor body that is opposite to the substrate or through the substrate or a hole in the substrate.

Layer pairs containing heavily doped degenerate semiconductor layers of opposite conductor types have already been used to develop optoelectronic components, such as multi-layer radiation detectors, that are described for example in the reference by M. Ilegems et al., titled "Integrated Multi-Junction GaAs Photodetector With High Output Voltage", in Applied Physics Letters 33 (7) 1978, pages 629 to 631, or multi-layer solar cells, which are described for example in the reference by D. L. Miller et al., Journal of Applied Physics 53 (1) 1982, pages 744 to 748. Furthermore, such pn junctions containing heavily doped degenerate semiconductor layers have been used to monolithically electrically connect stacks of individual semiconductor laser structures in series, as is described for example in the reference by C. P. Lee et al., Applied Physics Letters 30 (10) 1977, pages 535 to 538, or in U.S. Pat. No. 5,212,706.

In the above-mentioned cases, however, the sequence of heavily doped layers is used as an electrical contact between the optoelectronic components for connecting the latter in series. In contrast to this, in the case of the above-described optoelectronic component according to the invention, the sequence of heavily doped semiconductor layers is used to couple a resonator mirror layer of a first conductivity type to a semiconductor layer of a second conductivity type. In this case, parts of the layer sequence e.g. of a VCSEL component, of the kind known from the prior art, for example one or more layers of the resonator mirror layer or a barrier layer are replaced or supplemented by the heavily doped degenerate layers.

Other features which are considered as characteristic for the invention are set forth in the appended claims.

Although the invention is illustrated and described herein as embodied in an optoelectronic semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following-description of specific embodiments when read in connection with the accompanying drawings.

DETAILED DESCRIPTION OF THE PREFERRED EMBODIMENTS

Figure 1:
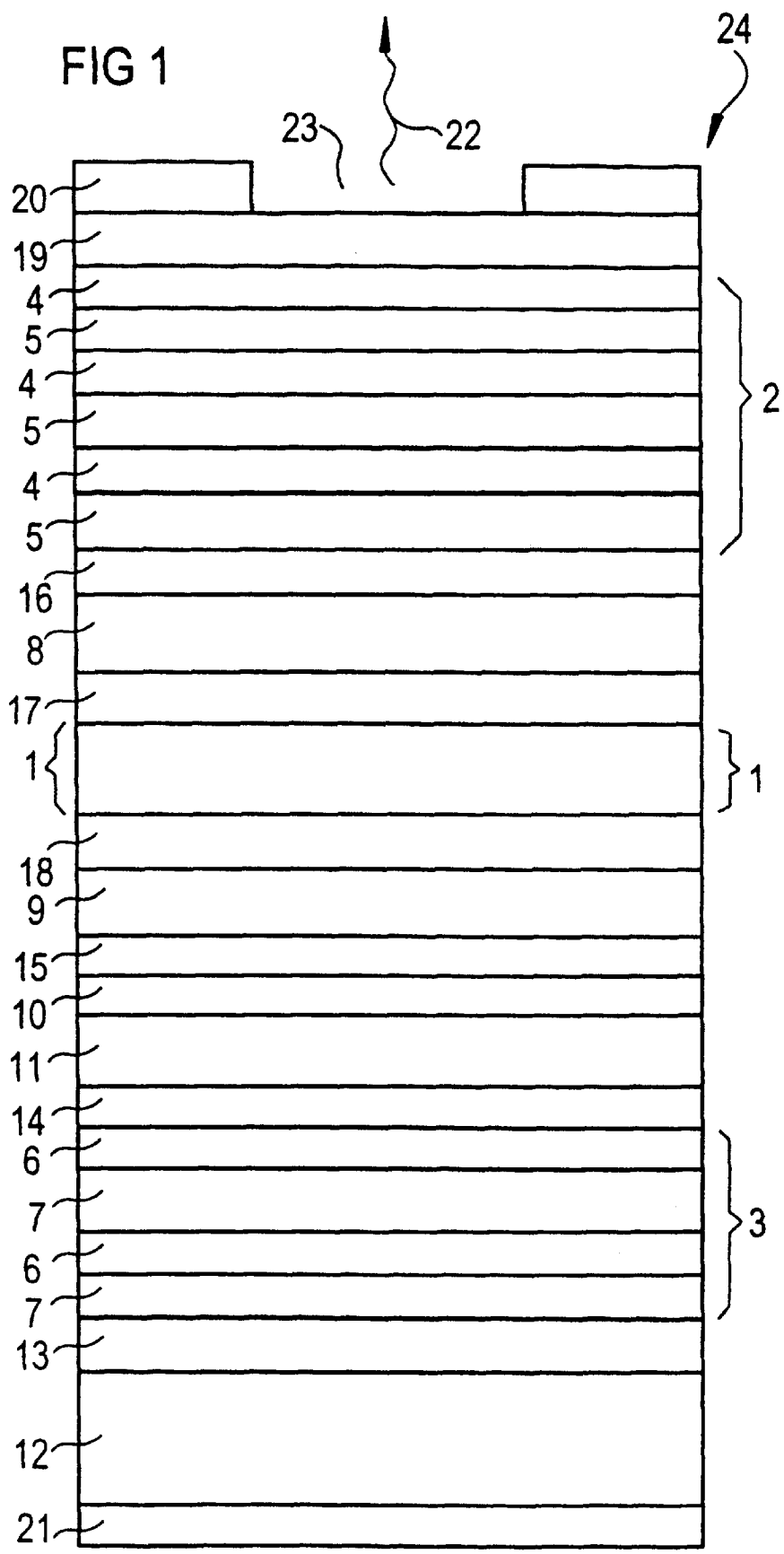
FIG. 1 is a diagrammatic, sectional view of a layer structure of a first exemplary embodiment according to the invention.

In all the figures of the drawing, sub-features and integral parts that correspond to one another bear the same reference symbol in each case. Referring now to the figures of the drawing in detail and first, particularly, to FIG. 1 thereof, there is shown a layer structure of a semiconductor body 24 of a laser emitting vertically with respect to the surface, a VCSEL diode. In the diode, laser radiation 22 is coupled out from the semiconductor body 24 through that side of the latter which is opposite to a semiconductor substrate 12. The semiconductor body 24 applied on the semiconductor substrate 12 of a first conductivity type (e.g. n-type conductivity) contains an active zone 1. The active zone 1 is configured as a multiple quantum well structure and is enclosed between a first barrier layer 8 of the first conductivity type and a second barrier layer 9 of a second conductivity type (e.g. p-type conductivity). A first matching layer 17 of the first conductivity type is disposed between the first barrier layer 8 and the active zone 1 and a second matching layer 18 of the second conductivity type is disposed between the second barrier layer 9 and the active zone 1. Given a suitable choice of material combinations for the active zone 1 and the barrier layers 8, 9, the matching layers 17, 18 can also be omitted.

The first barrier layer 8, situated on that side of the active zone 1 which is remote from the substrate 12, is connected to a top-side Bragg reflector layer 2 of the first conductivity type via a first intermediate layer 16 of the first conductivity type.

An underside Bragg reflection layer 3 on the substrate side is of the first conductivity type and is connected to the substrate 12 via a buffer layer 13 of the first conductivity type. That side of the underside Bragg reflector layer 3 which is remote from the substrate 12 is adjoined by a first heavily doped, degenerate junction layer 11 of the first conductivity type, which is connected to the underside Bragg reflector layer 3 by a second intermediate layer 14 of the first conductivity type. The second intermediate layer 14 can also be dispensed with given a suitable choice of materials.

On that side of the first heavily doped, degenerate junction layer 11 which is remote from the substrate, the junction layer 11 is adjoined by a second heavily doped, degenerate junction layer 10 of the second conductivity type. A third intermediate layer 15 of the second conductivity type is again optionally applied on the second junction layer 10, the second barrier layer 9 being disposed on the third intermediate layer 15.

An ohmic contact 20 is situated on that side of the top-side Bragg reflector layer 2 which is remote from the active zone 1. It being possible for a fourth intermediate layer 19 of the first conductivity type also to be disposed between the ohmic contact 20 and the top-side Bragg reflector layer 2. A further electrical contact 21 is situated on a rear side of the substrate 12.

During operation of the semiconductor component, an electric voltage is applied to the semiconductor body 24, via the contacts 20, 21 in such a way that the pn junction formed between the first barrier layer 8 and the first matching layer 17, on the one hand, and the second barrier layer 9 and the second matching layer 18, on the other hand, at the active zone 1 is forward-biased, and the pn junction formed between the first heavily doped, degenerate junction layer 11 and the second heavily doped, degenerate junction layer 10 is reverse-biased. For the case where the first conductivity type is n-type conductivity and the second conductivity type is p-type conductivity, the charge carriers from the valence band of the material in the second heavily doped, degenerate junction layer 10 can penetrate the energy barrier into the conductivity band of the material of the first heavily doped, degenerate junction layer 11, with the result that the current is carried by charge carriers of the second conductivity type on the side of the second heavily doped, degenerate junction layer 10. For the opposite case—where the first conductivity type is p-type conductivity and the second conductivity type is n-type conductivity—the charge carriers from the conductivity band of the material in the second heavily doped, degenerate junction layer 10 tunnel into the valence band of the material of the first heavily doped, degenerate junction layer 11.

Figure 2:
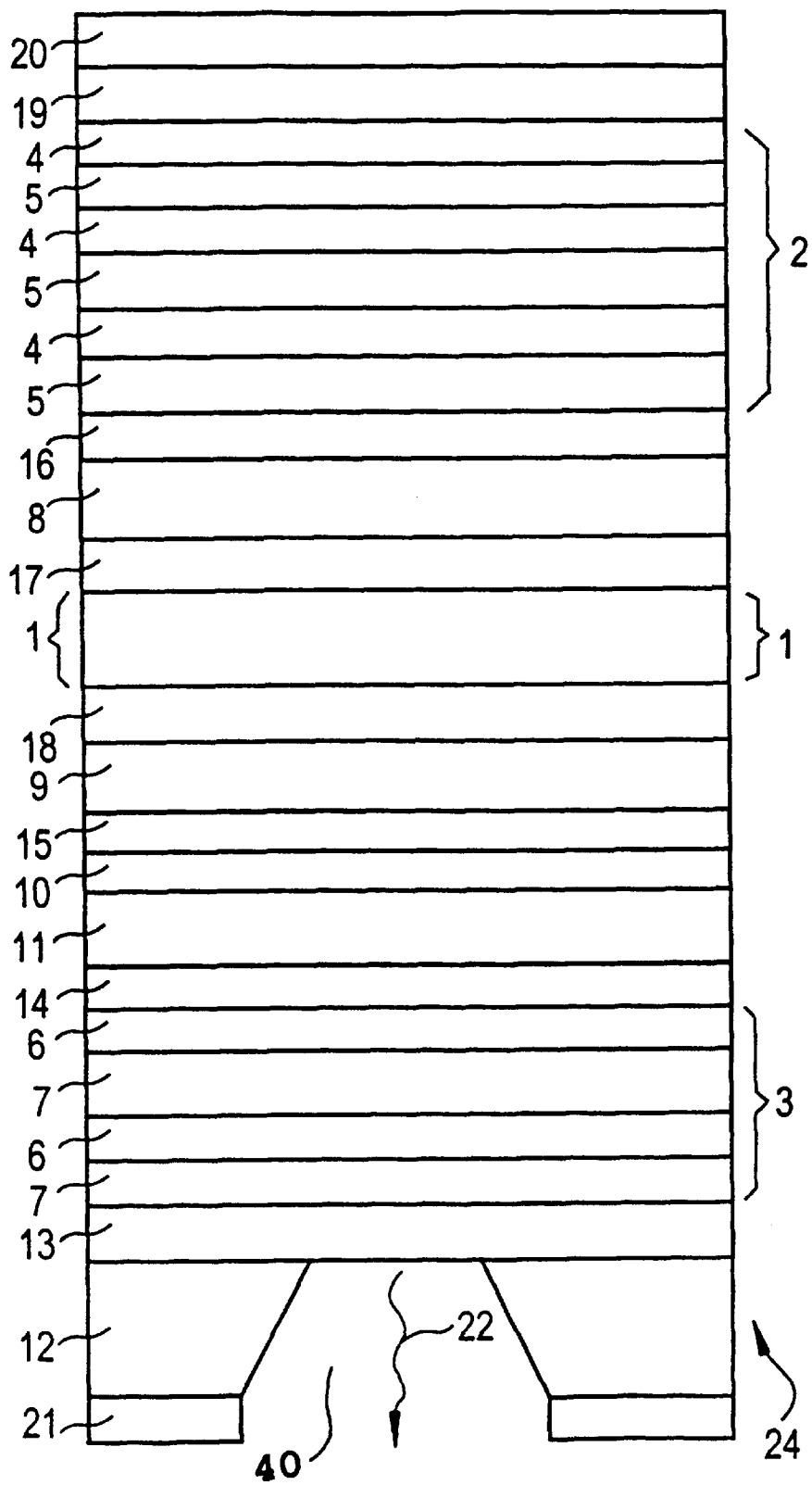
FIG. 2 is a sectional view of the layer structure of a second exemplary embodiment.

The exemplary embodiment shown in FIG. 2 differs from that shown in FIG. 1 by the fact that in this case the laser radiation 22 is coupled out from the semiconductor body 24 through the semiconductor substrate 12. To that end, a recess 40 is provided in the substrate 12 and in the contact layer 21.

Figure 3:
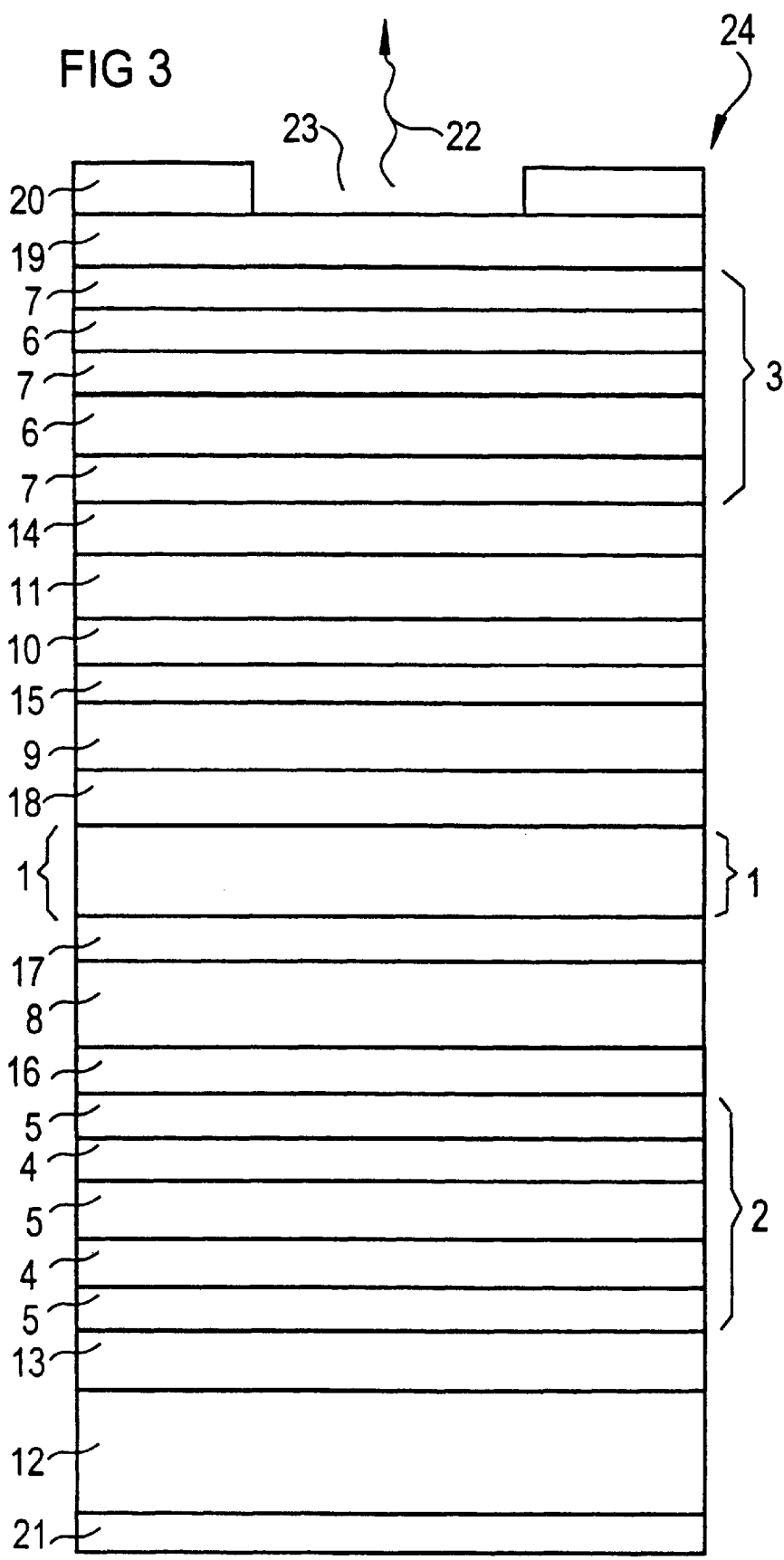
FIG. 3 is a sectional view of the layer structure of a third exemplary embodiment.
Figure 4:
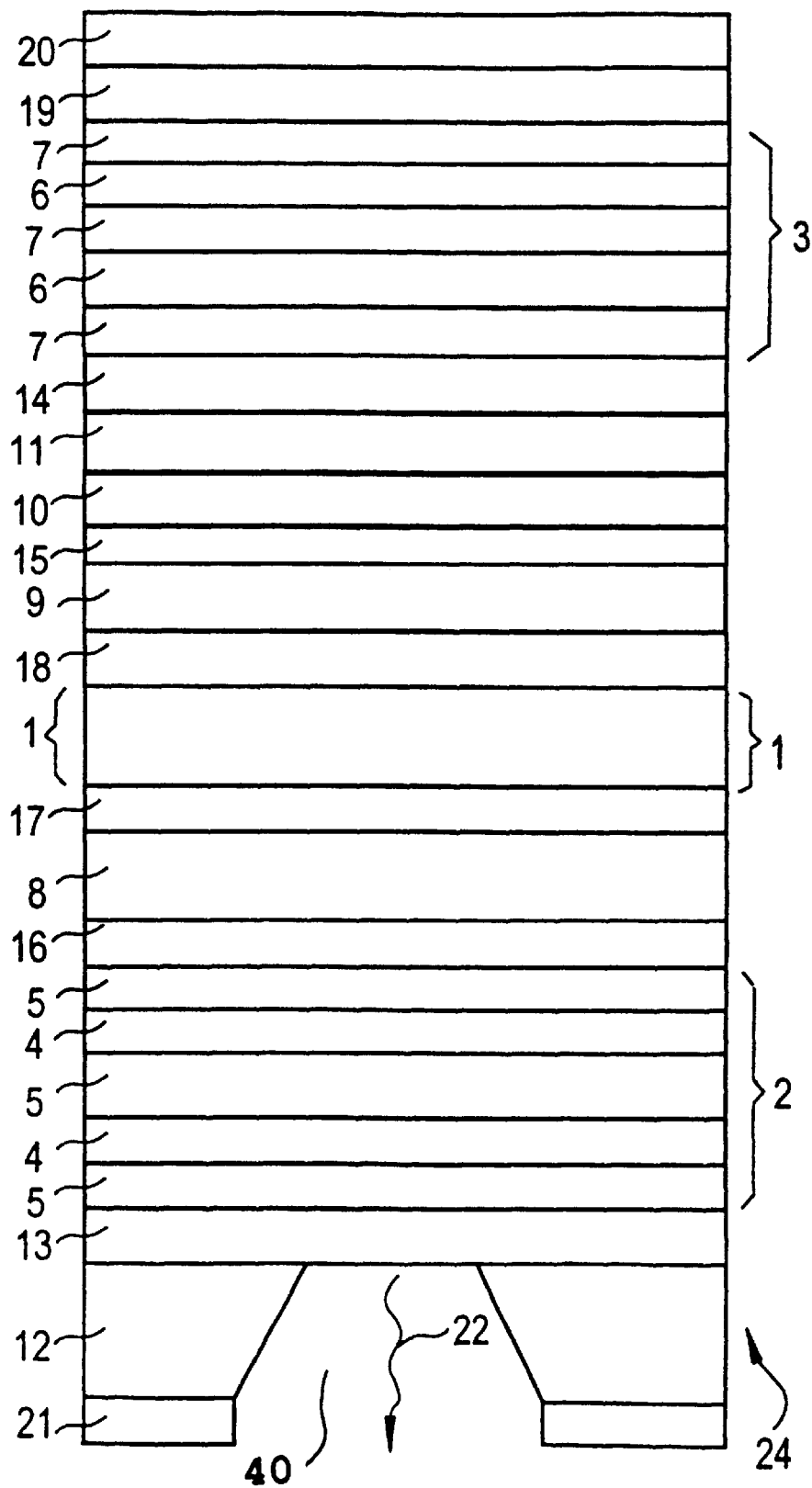
FIG. 4 is a sectional view of the layer structure of a fourth exemplary embodiment.

In contrast to the exemplary embodiments of the component according to the invention which are illustrated in FIGS. 1 and 2, in the case of the exemplary embodiments according to FIG. 3 and FIG. 4, the first heavily doped, degenerate junction layer 11 and the second heavily doped, degenerate junction layer 10 are situated on that side of the active zone 1 which is remote from the substrate 12. The pn junction formed by the heavily doped, degenerate junction layers 10, 11 consequently lies between the top-side Bragg reflector layer 3 and the active zone 1, in such a way that the second junction layer 10 is disposed between the latter and the first junction layer 11. In the configuration according to FIG. 3, the electromagnetic radiation is coupled out at a steep angle with respect to that surface of the semiconductor body 24 which is opposite to the substrate 12, through the contact 20 which is transparent or provided with the exit opening 23. In the embodiment according to FIG. 4, the laser radiation 22 (light wave) is emitted through the substrate 12 and the contact 21 which is transparent or provided with the exit opening 40, or through the recess 40 provided in the substrate 12 and in the contact 21. The function of the further intermediate layers 14, 15, 16, 19, the matching layers 17, 18, the barrier layers 8, 9 and the mirror layers 2, 3 and of the active zone 1 should, moreover, be understood to be analogous to the exemplary embodiments according to FIG. 1 and FIG. 2.

In accordance with the exemplary embodiments of FIG. 1 and FIG. 3, the top-side Bragg reflector layer 2 and respectively the underside Bragg reflector layer 3 are formed by alternating layers 4, 5 respectively having a high and low refractive index, whose sequence is repeated periodically. By analogy, the underside Bragg reflector layer 3 and respectively the top-side Bragg reflector layer 2 are produced from alternating layers 6, 7 respectively having a high and low refractive index. The thickness of the respective layer is chosen such that it is of a wavelength of the emitted electromagnetic radiation divided by the refractive index of the material respectively used for the layers 4, 5, 6, 7. In this case, the electrical conductivity and the structure of the layers 4, 5 are chosen such that the reflectivity and the conductivity are maximal vertically with respect to the layer stack of the top-side Bragg reflector layer 2 and respectively the underside Bragg reflector layer 3. The reflectivity of the respective Bragg reflector layer 2, 3 is set by the number of layer pairs.

In the embodiments according to the invention as shown in FIG. 1 and FIG. 3, the reflectivity of the top-side Bragg reflector layer 2 and 3, respectively, is set to be slightly less than that of the underside Bragg reflector layer 3 and 2, respectively, with the result that the electromagnetic wave that is generated is coupled out via the top side—opposite to the substrate side—of the semiconductor body 24 through a top-side contact 20 which is transparent or provided with an exit opening 23.

In the case of the exemplary embodiments of FIG. 2 and FIG. 4, the reflectivity of the underside Bragg reflector layer 3 and 2, respectively, is set to be slightly less than that of the top-side Bragg reflector layer 2 and 3, respectively, so that the light is coupled out from the semiconductor body 24 through the substrate 12 or through a recess 40 in the substrate 12.

The n-conducting layers 4, 5, 6, 7 are preferably used in the Bragg reflector layers 2, 3, which are Si-doped for example. Examples of material for these layers are AlAs, $Al_xGA_{1-x}As_yP_{1-y}$, GaAs or $Al_xGa_{1-x}As_xSb_{1-x}$, $In_xGa_{1-x}As_yP_{1-y}$ or II–VI semiconductor materials, such as e.g. $Zn_{1-x-y}Cd_xMg_ySe$, $Zn_{1-x}Cd_xSe_{1-y}Te_y$, $Be_xMg_yZn_{1-x-y}Te$, or $Be_xMg_yZn_{1-x-y}Se$.

The active zone 1 used for generating light may contain a generally undoped or weakly doped heterostructure, which may be configured as a single or multiple quantum well structure, the QW or MQW structure being embedded in the barrier layers 8, 9 having an opposite conductivity type. This results in the effective electrical charge carrier confinement in the active-zone when charge carriers are injected by forward-biasing this p-i-n structure. In the case of electron conductivity in one of the barrier layers 8 and 9, the doping should preferably be set in such a way that it is between $1*10^{16}$ cm$^{-3}$ and $5*10^{19}$ cm$^{-3}$, which is preferably achieved by incorporating Si. In the case of hole conductivity in the other of the barrier layers 8 and 9, a doping concentration of carbon or beryllium of $1*10^{16}$ $^{cm-3}$ and $5*10^{19}$ cm$^{-3}$ is preferably used.

The wavelength of the electromagnetic radiation that is generated can be set by way of the composition and the construction of the MQW structure 1 and also of the matching layers 17, 18 and of the barrier layers 8, 9. Examples of preferred materials for the active zone are InGaAsP and AlGaInAs or II–VI semiconductors, such as BeZnCdSe or ZnCdSeTe.

In the case of an MQW structure having InGaAs/GaAs, in particular, the barrier layers 8, 9 are preferably composed of AlGaAs, the Al content lying between 10 and 50%. AlGaAs with a linear variation in the Al content from 0% to 50%, for example, is used for the matching layers 17, 18, depending on the Al content of the adjoining layers. In this preferred example, the buffer layer 13 and the intermediate layers 14 and 19 are composed of GaAs and the intermediate layers 15 and 16 are composed of AlGaAs. By way of example, an Au/Ge or Ti/Pt/Au layer sequence is used as the contact layer for the electrical contacts 20, 21.

In order to inject charge carriers into the active zone, an electric voltage is applied to the electrical contacts 20, 21, in such a way that the p-i-n junction of the active zone is forward-biased. In this case, in the exemplary embodiments in accordance with FIG. 1 and FIG. 2, an electron current through the n-conducting top-side Bragg reflector layer 2 and 3, respectively, into the active zone 1 is generated. Electrons are extracted from the opposite underside contact 21 in the case of this biasing. For the exemplary embodiments in accordance with FIG. 3 and FIG. 4, the current transport takes place in the opposite direction.

In the region of the heavily doped, degenerate junction layers 10 and 11 having different conductivity types, the pn junction formed thereby is reverse-biased. As a result of which electrons in the high electric field building up there are drawn from the first heavily doped, degenerate junction layer 11 into the second heavily doped, degenerate junction layer 10, which corresponds to an effective hole current. In this case, for the first heavily doped, degenerate junction layer 11, the thickness is preferably between 5 nm and 200 nm and the doping is between $1*10^{17}$ cm$^{-3}$ and $1*10^{21}$ cm$^{-3}$ for n-type conductivity as the first conductivity type and between $1*10^{17}$ cm$^{-3}$ and $1*10^{21}$ cm$^{-3}$ for p-type conductivity as the first conductivity type. The thickness of the second heavily doped, degenerate junction layer 10 preferably lies between 5 nm and 200 nm and the doping in this layer is between $1*10^{17}$ cm$^{-3}$ and $1*10^{21}$ cm$^{-3}$ for n-type conductivity as the second conductivity type and between $1*10^{17}$ cm$^{-3}$ and $1*10^{21}$ cm$^{-3}$ for p-type conductivity as the second conductivity type. For matching the dopant concentrations and charge carrier potentials, the intermediate layers 14, 15 are also used in addition to the heavily doped, degenerate junction layers 10, 11, the doping in the intermediate layer 14 being of the same conductivity type as in the first heavily doped, degenerate layer 11, and the doping of the intermediate layer 15 being of the same conductivity type as the second heavily doped, degenerate junction layer 10. Under certain circumstances, a thin intermediate layer which is either of the first conductivity type, of the second conductivity type or undoped may be introduced between the second heavily doped, degenerate junction layer 10 and the first heavily doped, degenerate junction layer 11. Si is preferably used as the dopant for setting n-type conductivity, and carbon or beryllium may preferably be used as the dopant for p-type conductivity. The materials used for the heavily doped, degenerate layers 10, 11 are preferably semiconductor materials having a small band gap and a small effective charge carrier mass, in particular, for example, InGaAsP, InGaAlSb, InGaAlAs or InGaAlP.

The number, dopant concentration, layer thickness and composition of the intermediate layers 14, 15, 16, 17, 18 can vary in different exemplary embodiments, it being necessary to ensure that the potential barrier between the heavily doped, degenerate layers 10, 11 remains thin and can thus easily be penetrated by charge carriers, and that the layer thicknesses and refractive indices of the intermediate layers 14, 15, 16, 17, 18 and also of the heavily doped layers 10, 11, of the barrier layers 8, 9 and of the active zone 1 are chosen such that they contribute constructively to the reflectivity of the Bragg reflector layers 2, 3 on both sides and to the maximization of the intensity of the electromagnetic wave at the location of the active zone 1.

The description of the type and function of the individual layers in connection with the component according to the invention in accordance with the exemplary embodiment of FIG. 1 can be transferred, with corresponding indexing of the layer numbers, to the exemplary embodiments in accordance with FIGS. 2 to 4.

It goes without saying that the description of the optoelectronic semiconductor component according to the invention using the exemplary embodiments must not be understood as a restriction of the invention to these exemplary embodiments. VCSELs according to the invention may likewise be constructed on the basis of other semiconductor materials, such as e.g. GaAs, InAs, AlAs, GaN, AlN, InN, GaP, InP, AlP, GaSb, InSb, AlSb and mixed-crystal systems based on these binary compounds, and also ZnSe, CdSe, MgSe, BeSe, HgSe, ZnS, CdS, MgS, BeS, HgS, ZnTe, CdTe, MgTe, BeTe, HgTe, and mixed-crystal systems formed therefrom. Examples of suitable materials for the substrate 12 are Si, Ge, GAS, InAs, InGaAs, GaP, InP, $Al_2O_3$, SiC, CdTe, CdZnTe, ZnO or ZnSe.

We claim:

1. An optoelectronic component, comprising:
   a semiconductor substrate; and
   at least one semiconductor body suitable for generating electromagnetic radiation disposed above said semiconductor substrate, said at least one semiconductor body, including:
      at least one first mirror layer formed of a semiconductor material of a first conductivity type;
      at least one second mirror layer formed of said semiconductor material of said first conductivity type;
      at least one active zone in which the electromagnetic radiation is generated in an event of a current flow flowing through said at least one semiconductor body, said at least one active zone disposed between said at least one first mirror layer and said at least one second mirror layer;
      at least one first heavily doped, degenerate junction layer of said first conductivity type disposed between said at least one active zone and one of said at least one first mirror layer and said at least one second mirror layer; and
      at least one second heavily doped, degenerate junction layer of a second conductivity type disposed between said least one active zone and said first heavily doped, degenerate junction layer.

2. The optoelectronic component according to claim 1, wherein said at least one first heavily doped, degenerate junction layer and said at least one second heavily doped, degenerate junction layer are formed of degenerate semiconductor materials.

3. The optoelectronic component according to claim 2, wherein said at least one first heavily doped, degenerate junction layer and said at least one second heavily doped, degenerate junction layer each have a dopant concentration that is $>1*10^{17}$ cm$^{-3}$.

4. The optoelectronic component according to claim 1, wherein said at least one first mirror layer and said at least one second mirror layer are Bragg reflector layers.

5. The optoelectronic component according to claim 1, wherein said at least one first mirror layer and said at least one second mirror layer are doped in one of an n-conducting fashion and a p-conducting fashion.

6. The optoelectronic component according to claim 1, wherein said at least one first heavily doped, degenerate junction layer and said at least one second heavily doped, degenerate junction layer form a pn junction that is reverse-biased during operation of the optoelectronic component.

7. The optoelectronic component according to claim 1, wherein:
   said at least one semiconductor body has a contact layer being transmissive at least for part of the electromagnetic radiation; and
   one of said at least one first mirror layer and said at least one second mirror layer has a lower reflectivity than the other, and said one of said at least one first mirror layer and said at least one second mirror layer having the lower reflectivity is associated with said contact layer such that the electromagnetic radiation can be coupled out essentially through said one of said at least one first mirror layer and said at least one second mirror layer having the lower reflectivity and through said contact layer.

8. The optoelectronic component according to claim 1, wherein said at least one semiconductor body has a transparent contact layer on that side of said at least one semiconductor body which is opposite to said substrate, and the electromagnetic radiation is coupled out through said transparent contact layer.

9. The optoelectronic component according to claim 1, wherein said at least one semiconductor body has a contact layer on that side of said at least one semiconductor body which is opposite to said substrate, said contact layer having an exit opening formed therein, and the electromagnetic radiation is coupled out through said contact layer.

10. The optoelectronic component according to claim 1, including a transparent contact disposed on said substrate, said substrate being a transparent substrate and the electromagnetic radiation is coupled out from said at least one semiconductor body through said transparent substrate and said transparent contact.

11. The optoelectronic component according to claim 1, including a contact having a contact exit opening formed therein and disposed on said substrate, said substrate having a substrate exit opening formed therein, and the electromagnetic radiation is coupled out from said at least one semiconductor body through said substrate and said contact.

12. The optoelectronic component according to claim 1, wherein at least one of said at least one first mirror layer and said at least one second mirror layer is applied monolithically during a process for fabricating said at least one semiconductor body.

13. The optoelectronic component according to claim 1, wherein at least one of said at least one first mirror layer and said at least one second mirror layer is applied using hybrid technology after a fabrication of said at least one semiconductor body.

14. An optoelectronic component, comprising:

a semiconductor substrate; and at least one semiconductor body suitable for generating electromagnetic radiation disposed above said semiconductor substrate, said at least one semiconductor body, including:

at least one first mirror layer and at least one second mirror layer, all of said mirror layers formed of a semiconductor material of a first conductivity type;

at least one active zone in which the electromagnetic radiation is generated in an event of a current flow flowing through said at least one semiconductor body, said at least one active zone disposed between said at least one first mirror layer and said at least one second mirror layer;

at least one first heavily doped, degenerate junction layer of said first conductivity type disposed between said at least one active zone and one of said at least one first mirror layer and said at least one second mirror layer; and at least one second heavily doped, degenerate junction layer of a second conductivity type disposed between said at least one active zone and said first heavily doped, degenerate junction layer.

* * * * *